US012560553B2

(12) United States Patent
Kim

(10) Patent No.: US 12,560,553 B2
(45) Date of Patent: Feb. 24, 2026

(54) LASER CRYSTALLIZATION MONITORING DEVICE AND METHOD OF LASER CRYSTALLIZATION MONITORING USING THE SAME

(71) Applicant: Samsung Display Co., LTD., Yongin-si (KR)

(72) Inventor: Ji-Hwan Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 196 days.

(21) Appl. No.: 18/347,817

(22) Filed: Jul. 6, 2023

(65) Prior Publication Data

US 2024/0118221 A1    Apr. 11, 2024

(30) Foreign Application Priority Data

Oct. 6, 2022    (KR) ........................ 10-2022-0127695

(51) Int. Cl.
| | |
|---|---|
| *G01N 21/95* | (2006.01) |
| *H01L 21/02* | (2006.01) |
| *H01L 21/268* | (2006.01) |
| *H01L 21/66* | (2006.01) |
| *H01L 21/67* | (2006.01) |
(Continued)

(52) U.S. Cl.
CPC ....... *G01N 21/95* (2013.01); *H01L 21/02675* (2013.01); *H01L 21/268* (2013.01); *H01L 21/67253* (2013.01); *H01L 22/20* (2013.01); *B23K 26/0821* (2015.10); *G01N 2201/0636* (2013.01); *G01N 2201/0638* (2013.01); *H10D 30/0321* (2025.01)

(58) Field of Classification Search
CPC ........... G01N 21/95; G01N 2201/0636; G01N 2201/0638; H01L 21/02675; H01L 22/20; H01L 21/02532; H01L 21/02678; H01L 22/12; H01L 21/67253; H01L 21/268; H01L 21/67115; B23K 2103/56; B23K 26/032; B23K 26/0821; B23K 26/354; B23K 26/0643; B23K 26/0648; G02B 27/0955; G02B 13/0005
See application file for complete search history.

(56) References Cited

U.S. PATENT DOCUMENTS

| | | | |
|---|---|---|---|
| 6,697,096 B2 | 2/2004 | Agorio | |
| 2020/0088784 A1* | 3/2020 | Lei ........................... | H01L 22/12 |
| 2023/0278141 A1* | 9/2023 | Serizawa ............. | B23K 26/362 |
| | | | 347/233 |

FOREIGN PATENT DOCUMENTS

| | | | | |
|---|---|---|---|---|
| CN | 111293053 A | * | 6/2020 | ............. G01N 21/47 |
| KR | 10-2006-0048937 | | 5/2006 | |
| KR | 10-2015-0015254 | | 2/2015 | |

* cited by examiner

*Primary Examiner* — Georgia Y Epps
*Assistant Examiner* — Erin R Garber
(74) *Attorney, Agent, or Firm* — CANTOR COLBURN LLP

(57) ABSTRACT

A laser crystallization monitoring device includes a stage that supports a substrate, a laser beam generator that emits a laser beam to the substrate, a mirror that reflects the laser beam emitted from the laser beam generator and that rotates around a rotation axis, a first telecentric f-theta lens located on the laser beam path between the mirror and the substrate, a second telecentric f-theta lens through which the laser beam reflected from the substrate passes, and a monitor that inspects the laser beam passing through the second telecentric f-theta lens.

8 Claims, 9 Drawing Sheets

(51) Int. Cl.
  *B23K 26/082*      (2014.01)
  *H10D 30/01*       (2025.01)

F I G .  1
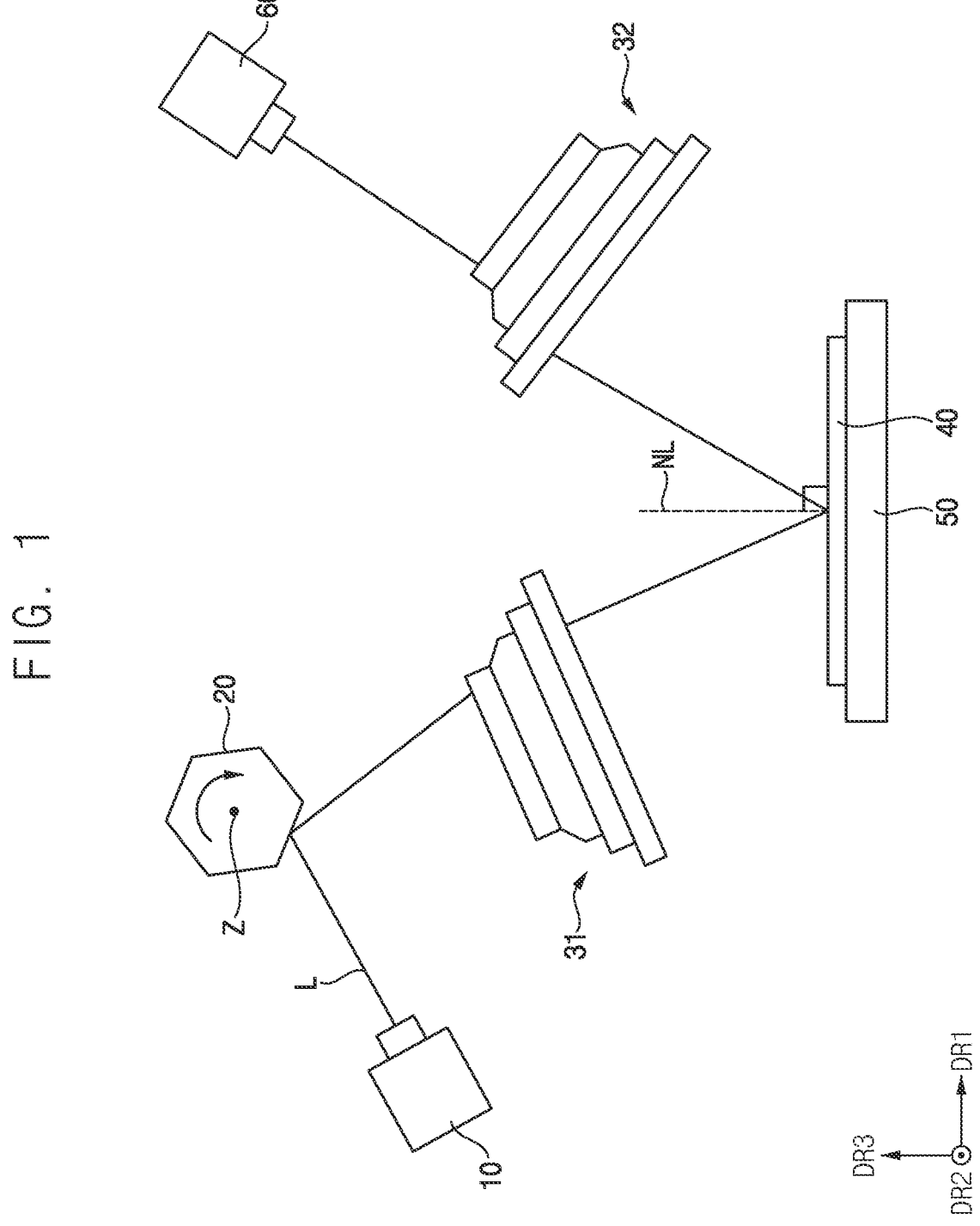

LASER CRYSTALLIZATION MONITORING DEVICE AND METHOD OF LASER CRYSTALLIZATION MONITORING USING THE SAME

CROSS-REFERENCE TO RELATED APPLICATION(S)

This application claims priority to and benefits of Korean Patent Application No. 10-2022-0127695 under 35 U.S.C. § 119, filed on Oct. 6, 2022 in the Korean Intellectual Property Office, the entire contents of which are incorporated herein by reference.

BACKGROUND

1. Technical Field

Embodiments relate to a laser crystallization monitoring device for manufacturing a polysilicon thin film having improved quality and a method of laser crystallization monitoring using the same.

2. Description of the Related Art

As information technology develops, the importance of a display device, which is a connection medium between a user and information, is emerging. As a result, the use of display devices such as liquid crystal display devices, organic light emitting display devices, plasma display devices, and the like is increasing.

A display device may include a thin film transistor, which is a special type of field effect transistor made using a semiconductor thin film on an insulating support substrate. Like the field effect transistor, the thin film transistor may be a device having three terminals: a gate, a drain, and a source, and a main function may be a switching operation. The thin film transistor may also be used for a sensor, a memory element, an optical element, and the like, but is typically used as a pixel switch element or a driving element of the display device As high performance may be required of a display device due to a trend towards larger sizes and higher definition, a manufacturing technology of a high performance thin film transistor having higher mobility than an amorphous silicon thin film transistor having electron mobility of about 0.5~1 cm2 Vs may be required. Polycrystalline silicon thin film transistors (poly-Si TFTs) may have much higher performance than comparative amorphous silicon thin film transistors. A polycrystalline silicon thin film transistor may have mobility of tens to hundreds cm2/Vs. Accordingly, a data driving circuit or a peripheral circuit that requires high mobility can be embedded in a substrate, and a channel of the transistor can be reduced to increase the aperture of the screen. In addition, high resolution is possible, driving voltage and power consumption may be lowered, and a problem of deterioration of device characteristics may be very small because there may be no limit to the wiring pitch for connecting the driving circuit by the increase in the number of pixels due to the built-in nature of the driving circuit.

Eximer laser crystallization (ELC) technology, and the like that crystallize amorphous silicon to make polycrystalline silicon are being studied to make the polycrystalline silicon thin film transistor. However, since the degree of crystallization of the polycrystalline silicon may be difficult to be observed visually, and the tolerance range may be limited, methods and apparatuses for maintaining the crystallinity of polycrystalline silicon uniformly may be desired.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments provide a laser crystallization monitoring device for uniformly maintaining crystallinity of polycrystalline silicon.

Embodiments provide a laser crystallization monitoring method.

A laser crystallization monitoring device according to an embodiment may include a stage that supports a substrate, a laser beam generator that emits a laser beam to the substrate, a mirror that reflects the laser beam emitted from the laser beam generator and that rotates around a rotation axis, a first telecentric f-theta lens located on the laser beam path between the mirror and the substrate, a second telecentric f-theta lens through which the laser beam reflected from the substrate passes, and a monitor that inspects the laser beam passing through the second telecentric f-theta lens.

In an embodiment, the mirror may be a polygon mirror.

In an embodiment, the monitor may include a camera

In an embodiment, the laser beam may form a polysilicon thin film by crystallizing an amorphous silicon thin film formed on the substrate.

In an embodiment, the substrate may be disposed on a plane formed by a first direction and a second direction perpendicular to the first direction, and the stage may move the substrate in the first direction In an embodiment, the mirror may continuously change an irradiation angle of the laser beam.

In an embodiment, the second telecentric f-theta lens and the first telecentric f-theta lens may be disposed in mirror symmetry with respect to a normal line of the substrate.

In an embodiment, the monitor and the mirror may be disposed in mirror symmetry with respect to a normal line of the substrate.

In an embodiment, the laser beam may be a linearly polarized laser beam

A laser crystallization monitoring device according to an embodiment may include a stage that supports a substrate, a laser beam generator that emits a laser beam to the substrate, a first mirror that reflects the laser beam emitted from the laser beam generator and that rotates around a rotation axis, a telecentric f-theta lens located on the laser beam path between the first mirror and the substrate, a lens located on the laser beam path between the substrate and the telecentric f-theta lens, and a monitor that inspects the laser beam passing through the second telecentric f-theta lens.

In an embodiment, the first mirror may be a polygon mirror.

In an embodiment, the lens may be a cylindrical lens.

In an embodiment, the laser beam reflected by the first mirror may pass through the telecentric f-theta lens and the lens, may be reflected by the substrate, and may pass through the lens and the telecentric f-theta lens again to be irradiated to the monitor.

In an embodiment, each of the laser beam generator and the monitor may be located on an opposite side of the substrate with respect to the telecentric f-theta lens and the lens.

In an embodiment, the monitor may include a camera.

In an embodiment, the laser beam may be a linearly polarized laser beam.

In an embodiment, the lens may refract the laser beam passing through the telecentric f-theta lens, may refract the laser beam reflected by the substrate, and may make the laser beam incident on the telecentric f-theta lens.

In an embodiment, the laser crystallization monitoring device may further include a second mirror on the laser beam path between the telecentric f-theta lens and the monitor.

A method of laser crystallization monitoring according to an embodiment may include irradiating a linearly polarized laser beam onto a mirror rotating around a rotation axis, making the laser beam reflected by the mirror incident on a telecentric f-theta lens, making the laser beam passing through the telecentric f-theta lens incident on an amorphous silicon layer formed on a substrate through a cylindrical lens, making the laser beam reflected by the amorphous silicon layer incident on the telecentric f-theta lens through the cylindrical lens, and making the laser beam passing through the telecentric f-theta lens incident on a monitor.

In an embodiment, the mirror may be a polygon mirror, and the monitoring unit may include a camera.

According to an embodiment of the disclosure, a laser crystallization monitoring device may include a stage supporting a substrate, a laser beam generator emitting a laser beam to the substrate, a mirror reflecting the laser beam emitted from the laser beam generator and rotatable around a rotation axis, a first telecentric f-theta lens located on the laser beam path between the mirror and the substrate, a second telecentric f-theta lens through which the laser beam reflected from the substrate passes, and a monitor inspecting the laser beam passing through the second telecentric f-theta lens.

According to another embodiment of the disclosure, a laser crystallization monitoring device may include a stage supporting a substrate, a laser beam generator emitting a laser beam to the substrate, a first mirror reflecting the laser beam emitted from the laser beam generator and rotatable around a rotation axis, a telecentric f-theta lens located on the laser beam path between the first mirror and the substrate, a lens located on the laser beam path between the substrate and the telecentric f-theta lens, and a monitor inspecting the laser beam passing through the second telecentric f-theta lens.

Accordingly, in case that a process of crystallizing an amorphous silicon thin film to form a polycrystalline silicon thin film proceeds, the occurrence of a laser beam location error due to a processing error of the polygon mirror, a phenomenon that a rotating shaft of the polygon mirror is twisted, and a phenomenon that an air trap is generated on the substrate may be monitored. Therefore, an optimal degree of silicon crystallization can be maintained by properly setting the laser crystallization device, such as detecting a silicon crystallization defect in advance and tuning the mirror.

BRIEF DESCRIPTION OF THE DRAWINGS

Illustrative, non-limiting embodiments will be more clearly understood from the following detailed description in conjunction with the accompanying drawings.

FIG. 1 is a front view schematically illustrating a laser crystallization monitoring device according to an embodiment.

DETAILED DESCRIPTION OF THE EMBODIMENTS

Figure 2:
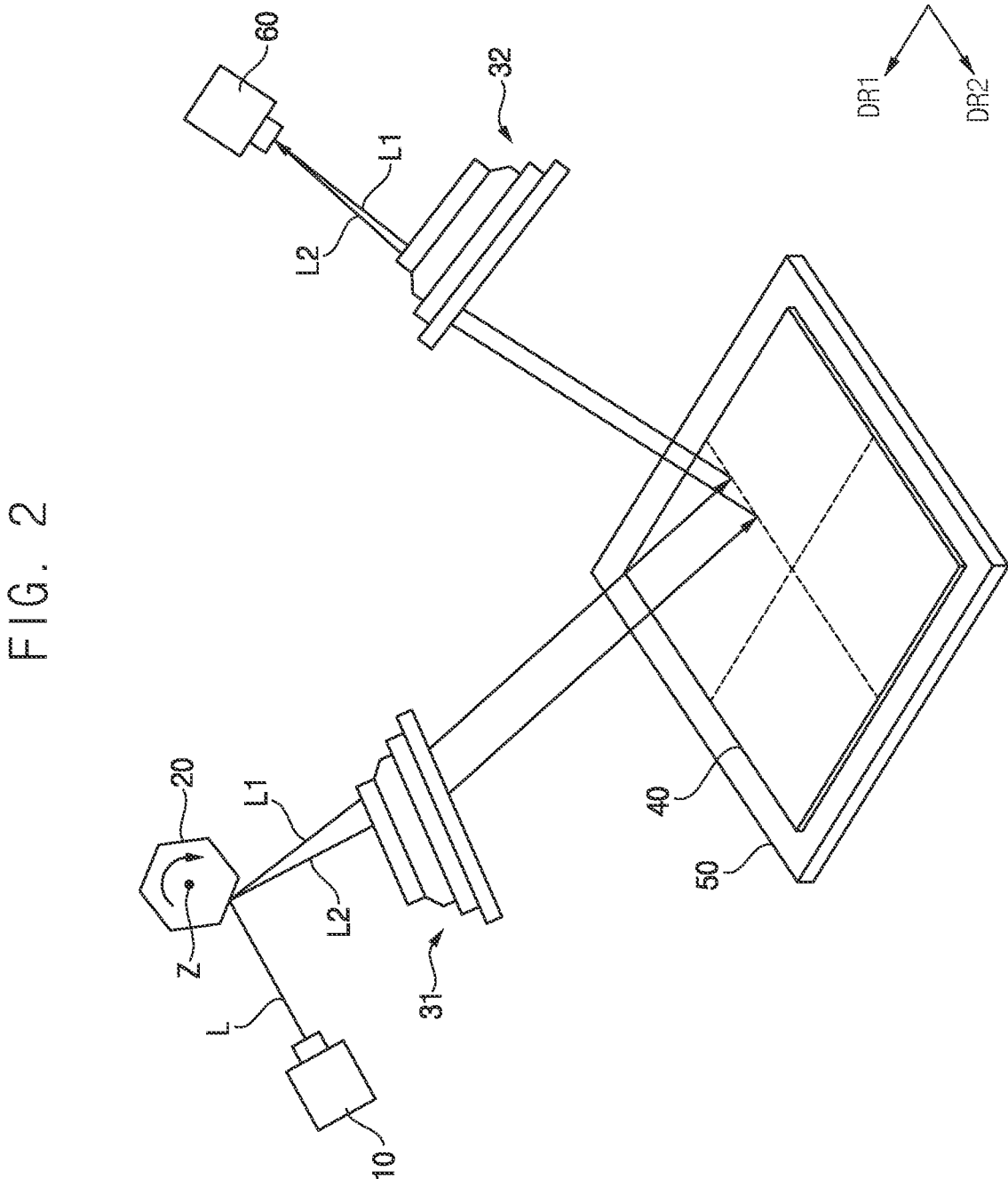
FIG. 2 is a perspective view schematically illustrating the laser crystallization monitoring device of FIG. 1.

Hereinafter, embodiments will be described in more detail with reference to the accompanying drawings. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

The same reference numerals are used for the same components in the drawings, and redundant descriptions of the same components will be omitted.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean any combination including "A, B, or A and B." The terms "and" and "or" may be used in the conjunctive or disjunctive sense and may be understood to be equivalent to "and/or."

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3:
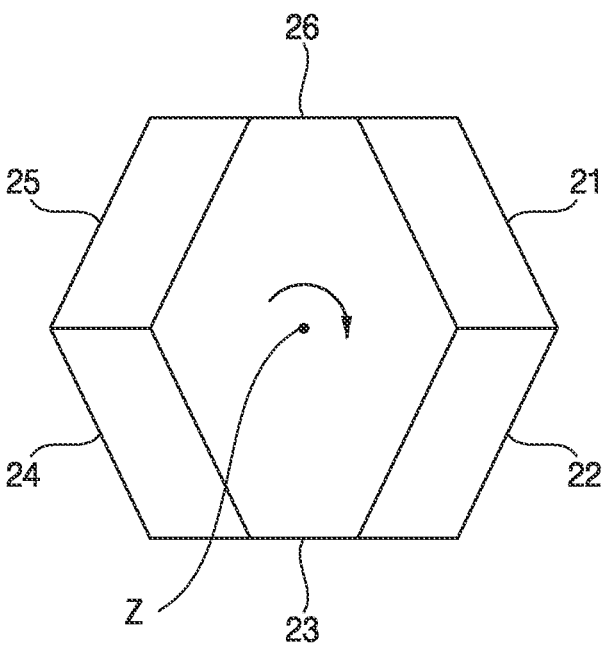
FIG. 3 is a diagram schematically illustrating a polygon mirror of the laser crystallization monitoring device of FIG. 1.

FIG. 1 is a front view schematically illustrating a laser crystallization monitoring device according to an embodiment. FIG. 2 is a perspective view schematically illustrating the laser crystallization monitoring device of FIG. 1. FIG. 3 is a diagram schematically illustrating a polygon mirror of the laser crystallization monitoring device of FIG. 1.

Referring to FIG. 1, a laser crystallization monitoring device may include a laser beam generator 10, a mirror 20, a first telecentric f-theta lens 31, a substrate 40, a stage 50, a second telecentric f-theta lens 32, and a monitoring unit (monitor) 60.

The laser beam generator 10 may emit the laser beam L. The laser beam L may be formed using a laser generated by a laser oscillator, and the laser can be a gas laser or a solid laser. Examples of a gas laser may include an argon (Ar) laser, a krypton (Kr) laser, and the like, and examples of a solid laser may include a YAG laser, a YVO4 laser, a YLF laser, a YA103 laser, a Y203 laser, a glass laser, a ruby laser, a Alexandrite laser, a titanium sapphire laser, and the like.

In an embodiment, the laser beam generator 10 may emit a linearly polarized laser beam. The laser beam generator 10 may include a portion from which the laser beam is emitted and a linearly polarized plate.

The mirror 20 may reflect the laser beam L incident from the laser beam generator 10. The mirror 20 may rotate around a rotation axis Z. In an embodiment, the mirror 20 may be a polygon mirror.

The laser beam L emitted from the laser beam generator 10 may be reflected from the mirror 20 and may pass through the first telecentric f-theta lens 31. Thereafter, the laser beam L passing through the first telecentric f-theta lens 31 may be incident on an amorphous silicon layer (not shown) on the substrate 60 seated on the stage 50.

Referring to FIGS. 1 to 3, as the mirror 20 rotates around the rotation axis Z, an angle at which the laser beam L is incident on the amorphous silicon layer on the substrate 60 may be continuously changed. Specifically, in case that the polygon mirror of FIG. 4 rotates around the rotation axis Z, reflective surfaces 21, 22, 23, 24, 25, and 26 of the polygon mirror from which the laser beam L emitted from the laser beam generator 10 is reflected may be continuously changed. Accordingly, an angle of the laser beam L incident on the first telecentric f-theta lens 31 may be continuously changed. Accordingly, the positions at which laser beams L1 and L2 reflected by the mirror 20 are incident on the amorphous silicon layer on the substrate 60 may be continuously changed.

The stage 50 may support the substrate 40 to which the laser beam L is irradiated. The stage 50 may include a plane formed by a first direction DR1 and a second direction DR2 perpendicular to the first direction DR1. The substrate 40 may be disposed on the plane formed by the first direction DR1 and the second direction DR2. The stage 50 may move the substrate 40 in the first direction DR1. Accordingly, the laser beam L may scan the entire substrate 40.

An amorphous silicon thin film may be formed on the substrate 40. The amorphous silicon thin film may be formed using a silicon or a silicon-based material (for example, $Si_xGe_{1-x}$) by a method such as a sputtering method, a reduced pressure CVD, or a plasma CVD method. The laser beam L may be irradiated on the amorphous silicon thin film to crystallize the amorphous silicon thin film, and thus a polycrystalline silicon (polysilicon) thin film may be formed.

The laser beam L reflected from the substrate 40 may pass through the second telecentric f-theta lens 32. In an embodiment, the second telecentric f-theta lens 32 and the first telecentric f-theta lens 31 may be disposed in mirror symmetry with respect to a normal line NL of the substrate 40.

The laser beam L passing through the second telecentric f-theta lens 32 may be inspected by the monitoring unit 60. In an embodiment, the monitoring unit 60 may include a camera. In an embodiment, the monitoring unit 60 and the mirror 20 may be disposed in mirror symmetry with respect to the normal line NL of the substrate 40.

Figure 4:
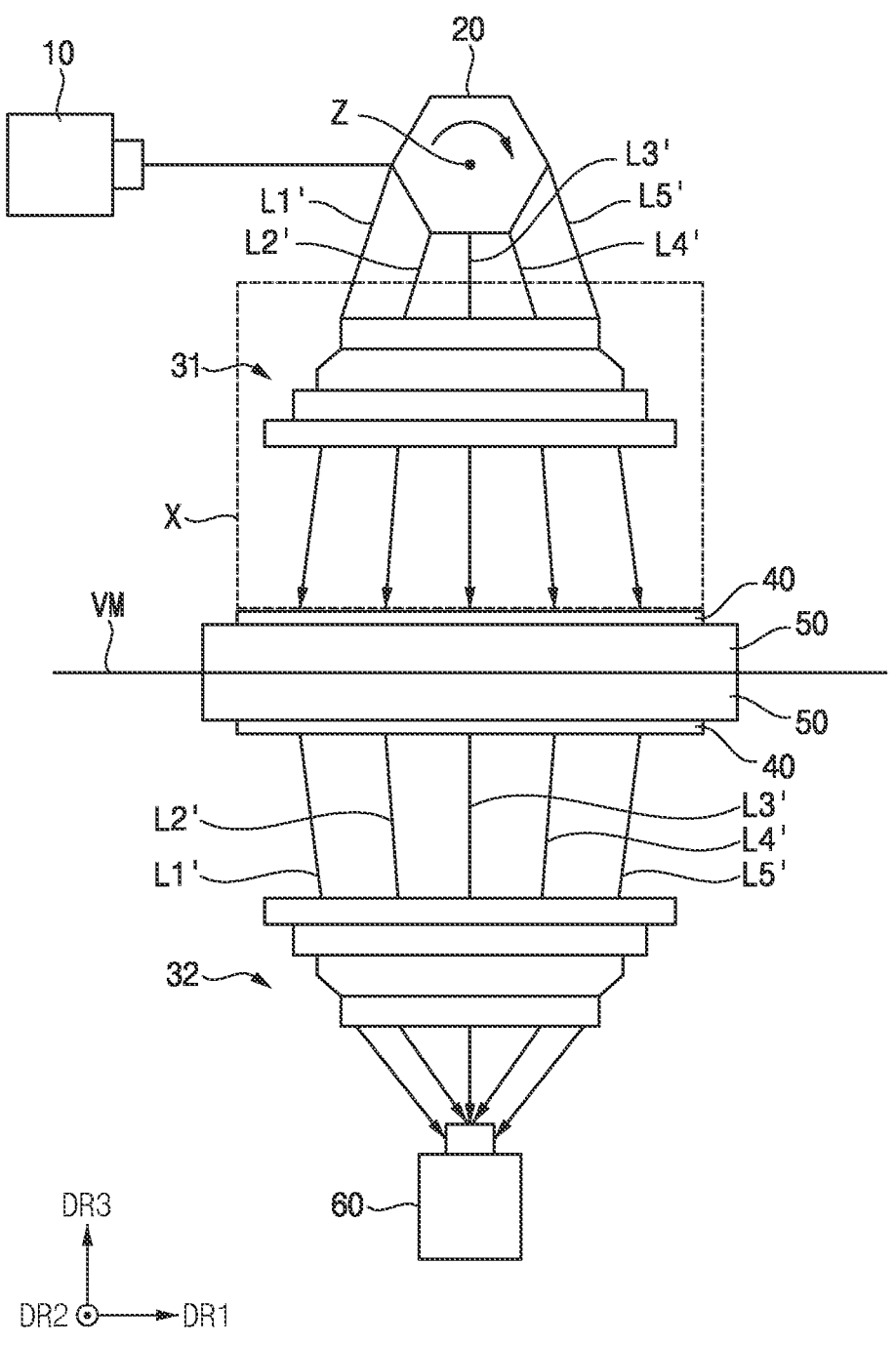
FIG. 4 is a front view schematically illustrating a symmetrical structure of the laser crystallization monitoring device of FIG. 1.

FIG. 4 is a front view schematically illustrating a symmetrical structure of the laser crystallization monitoring device of FIG. 1.

For example, FIG. 4 is a diagram illustrating laser beams L1', L2', L3', L4', L5' which may be reflected by the mirror 20 passing through the first telecentric f-theta lens 31 and entering the substrate 40 with laser beams L1', L2', L3', L4', L5' which may be reflected by the substrate 40 passing through the second f-theta lens 32 and entering the monitoring unit 60 in the form of decalcomanie in order to emphasize the symmetrical characteristics of the laser crystallization monitoring device of FIG. 1.

Referring to FIGS. 1, 2 and 4, as mentioned before, the second telecentric f-theta lens 32 and the first telecentric f-theta lens 31 may be disposed in mirror symmetry with respect to a normal line NL of the substrate 40. The monitoring unit 20 and the mirror 20 may be disposed in mirror symmetry with respect to the normal line NL of the substrate 40. Therefore, it can be understood that the laser crystallization monitoring device according to an embodiment of the disclosure has a symmetrical structure with respect to the virtual mirror VM of FIG. 4.

Figure 5:
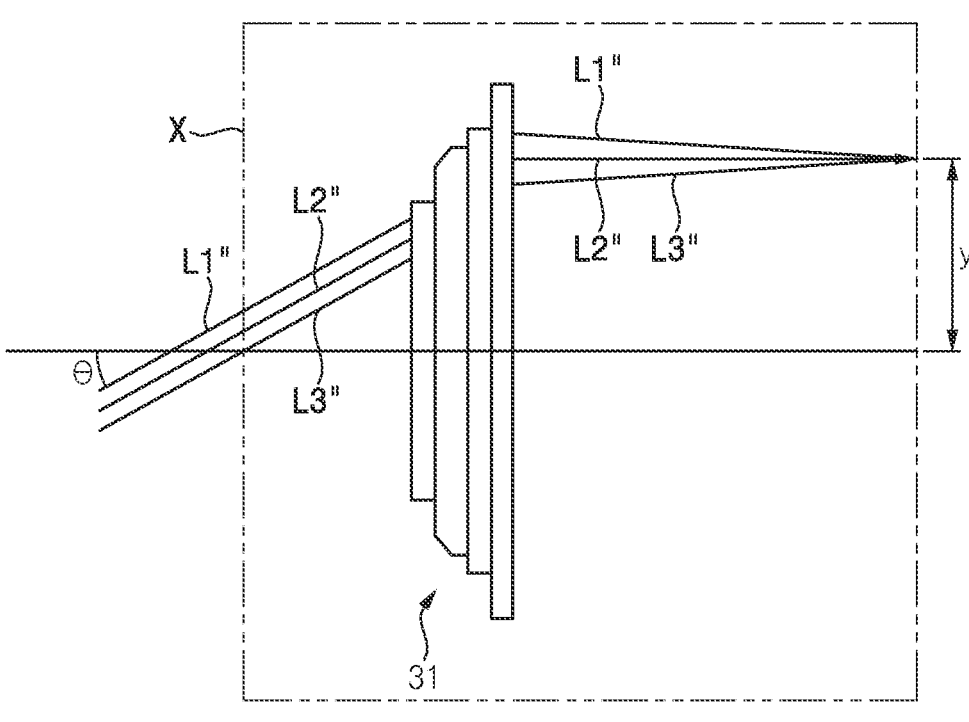
FIG. 5 is an enlarged view schematically illustrating an example of an X region of FIG. 4.
Figure 5:
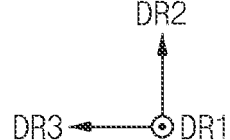

FIG. 5 is an enlarged view schematically illustrating an example of an X region of FIG. 4. Specifically, FIG. 5 is a cross-sectional view illustrating that laser beams L1", L2", and L3" passing through the first telecentric f-theta lens 31 incident on the substrate (e.g., the substrate 40 of FIG. 1).

Referring to FIG. 5, laser beams L1", L2", and L3" may enter the first telecentric f-theta lens 31 while forming a predetermined or selected angle θ with a normal line (e.g., the normal line NL in FIG. 1) of the substrate. If the first telecentric f-theta lens 31 is used, the laser beams L1", L2", and L3" may be vertically incident on the substrate regardless of the angle formed by the normal line of the substrate.

A position y at which the laser beams L1", L2", L3" are incident on the substrate is a distance in the second direction DR2 from a middle point of the substrate and the first telecentric f-theta lens 31 to the laser beam incident on the substrate in cross-section.

The laser beams L1", L2", and L3" may be incident at different positions of the first telecentric f-theta lens 31. Since the laser beams L1", L2", L3" are incident on the first telecentric f-theta lens 31 at the same angle θ formed with the normal line of the substrate, the laser beams L1", L2", and L3" may be vertically incident at the same position y on the substrate.

Figure 6A:
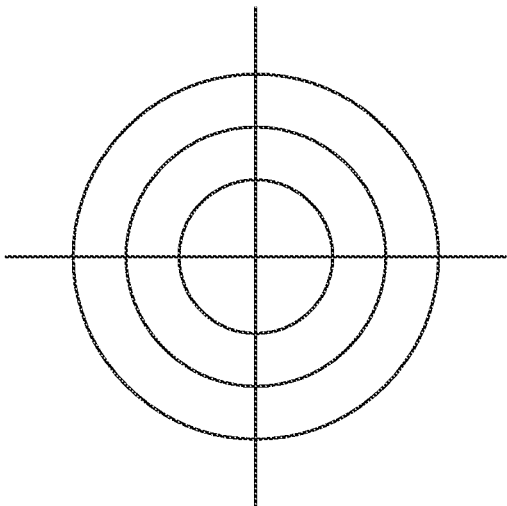
FIGS. 6A and 6B are schematic forms of a laser beam measured using the laser crystallization monitoring device of FIG. 1.
Figure 6B:
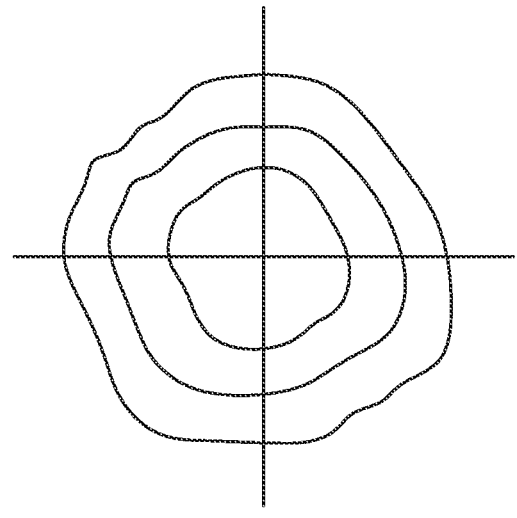

FIGS. 6A and 6B are schematic forms of a laser beam measured using the laser crystallization monitoring device of FIG. 1.

Referring to FIG. 1, FIG. 6A and FIG. 6B, FIG. 6A schematically illustrates the shape of the laser beam L in case that the laser beam L is incident on the mirror 20. FIG.

6B schematically illustrates the shape of the laser beam L in case that the laser beam L enters the monitoring unit 60. For example, [B] of FIG. 6 schematically illustrates the shape of the laser beam L distributed or deformed.

The laser beam L incident on the mirror 20 may have a shape close to a perfect circle (see FIG. 6A). On the other hand, if a processing error occurs in the mirror 20, the rotation axis Z of the mirror 20 is twisted, or a thermal lensing effect occurs, the laser beam L reflected by the mirror 20 may be scattered or deformed. The scattered or deformed laser beam L may be incident on the amorphous silicon layer formed on the substrate 40. Accordingly, the amorphous silicon layer may be non-uniformly crystallized. Accordingly, the laser beam L incident and reflected on the substrate 40 in a distributed or deformed form may be inspected by the monitoring unit 60 through the second telecentric f-theta lens 32.

Figure 7:
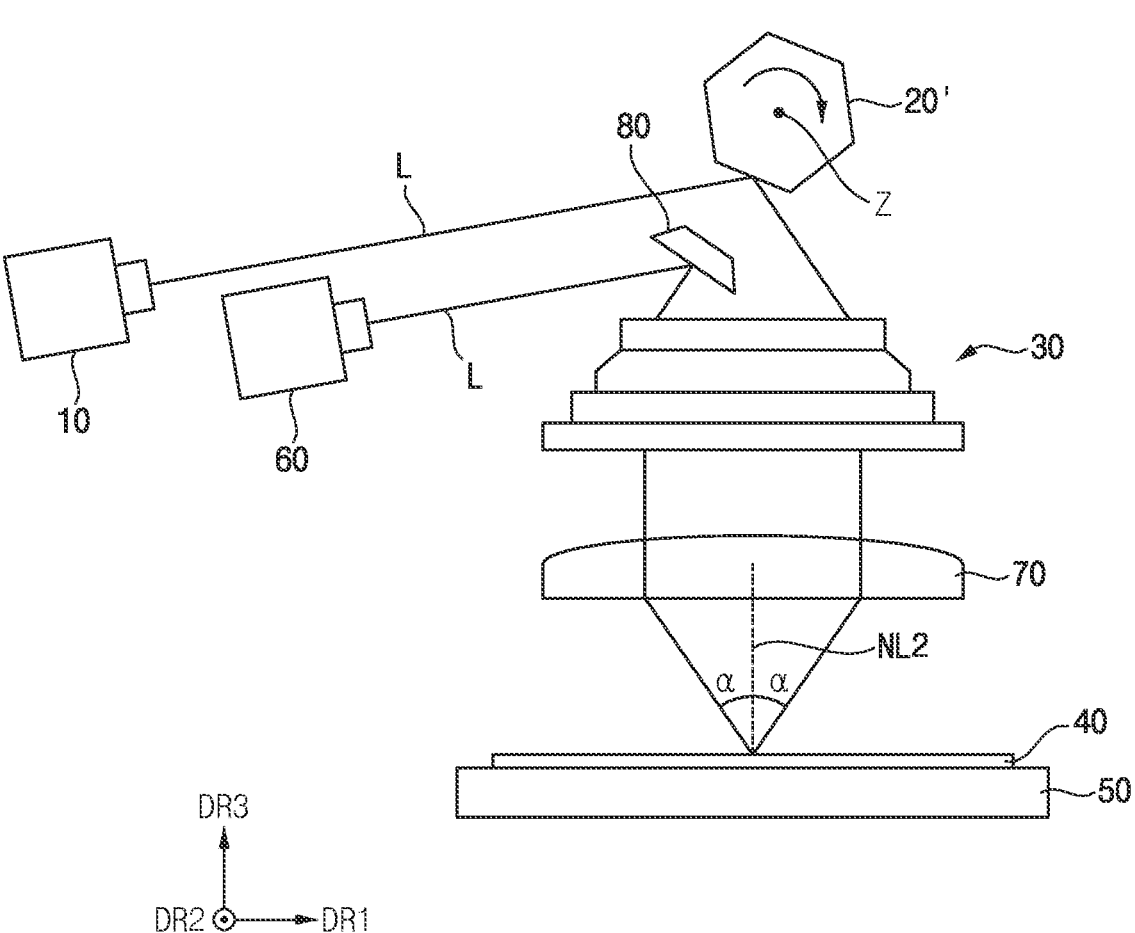
FIG. 7 is a front view schematically illustrating a laser crystallization monitoring device according to another embodiment.
Figure 8:
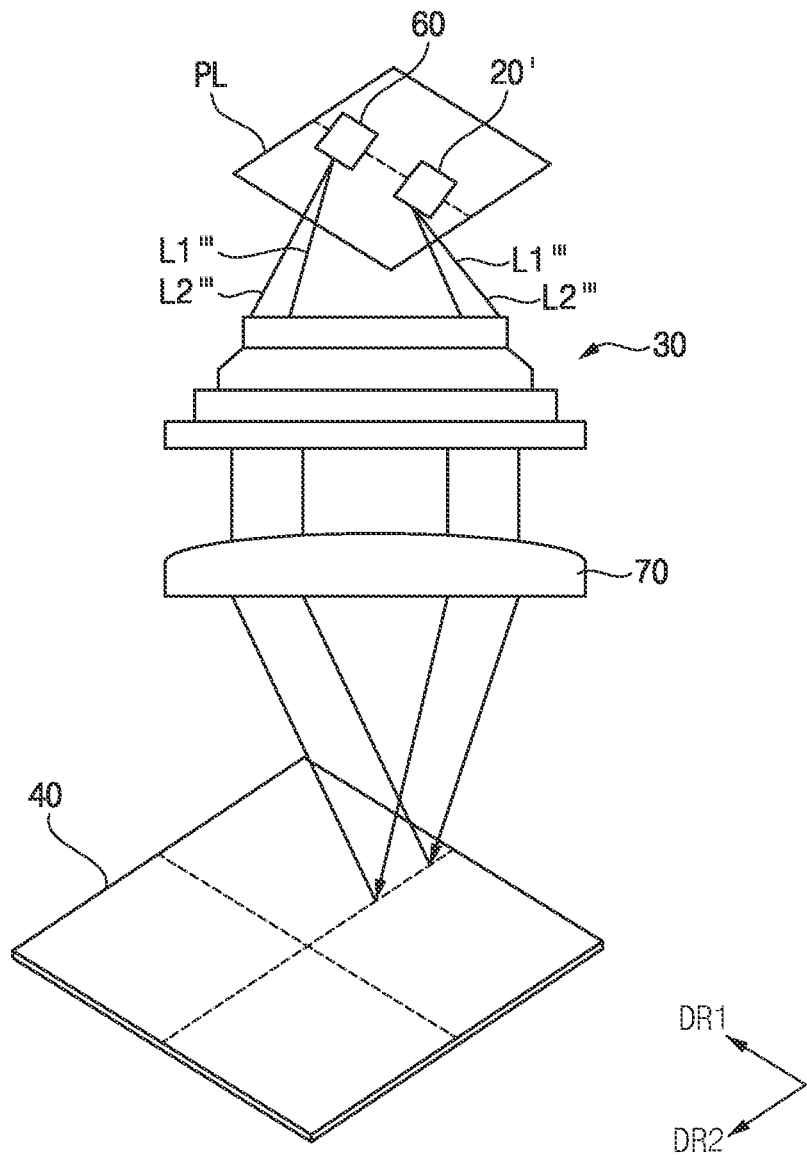
FIG. 8 is a perspective view schematically illustrating the laser crystallization monitoring device of FIG. 7.

FIG. 7 is a front view schematically illustrating a laser crystallization monitoring device according to another embodiment. FIG. 8 is a perspective view schematically illustrating the laser crystallization monitoring device of FIG. 7.

Referring to FIG. 7 and FIG. 8, a laser crystallization monitoring device according to another embodiment may include a laser beam generator 10, a first mirror 20, a telecentric f-theta lens 30, a lens 70, a substrate 40, a stage 50, a second mirror 80, and a monitoring unit (monitor) 60.

The laser beam generator 10 may emit a linearly polarized laser beam. The laser beam generator 10 may include a portion from which the laser beam is emitted and a linearly polarized plate.

The first mirror 20' may reflect the laser beam L incident from the laser beam generator 10. The first mirror 20' may rotate around a rotation axis Z. In an embodiment, the first mirror 20' may be a polygon mirror.

The laser beam L emitted from the laser beam generator 10 may be reflected from the first mirror 20' and may pass through the telecentric f-theta lens 30. Thereafter, the laser beam L may be incident on an amorphous silicon layer (not shown) on the substrate 40 seated on the stage 50.

Referring further to FIG. 3, the first mirror 20' may rotate around the rotation axis Z. Accordingly, an angle at which the laser beam L is incident on the amorphous silicon layer on the substrate 60 may be continuously changed. Specifically, in case that the polygon mirror of FIG. 3 rotates around the rotation axis Z, reflective surfaces 21, 22, 23, 24, 25, and 26 of the polygon mirror from which the laser beam L emitted from the laser beam generator 10 is reflected may be continuously changed. Accordingly, an angle of the laser beam L incident on the telecentric f-theta lens 30 may be continuously changed. Accordingly, the positions at which laser beams L1'" and L2" are incident on the amorphous silicon layer on the substrate 60 may be continuously changed along to the second direction DR2

The stage 50 may support the substrate 40 to which the laser beam L is irradiated. The stage 50 may include a first direction DR1 and a second direction DR2 perpendicular to the first direction DR1. The substrate 40 may be disposed on the plane formed by the first direction DR1 and the second direction DR2 perpendicular to the first direction DR1. The stage 50 may move the substrate 40 in the first direction DR1. Accordingly, the laser beam L may scan the entire substrate 40.

The laser beam L reflected by the first mirror 20' may pass through the telecentric f-theta lens 30.

The laser beam L may pass through the lens 70. The laser beam L may be refracted by the lens 70. In an embodiment, the lens 70 may be a cylindrical lens. The laser beam L passing through the lens 70 may be incident on the substrate 40 while forming a specific angle α with a normal line NL2 of the substrate 40. The laser beam L may crystallize an amorphous silicon layer formed on the substrate 40. Thereafter, it may be reflected while forming a specific angle α with the normal line NL2 of the substrate 40. In an embodiment, the angle α formed by the laser beam L and the normal line NL2 in case that the laser beam L enters the substrate 40 may be the same as the angle α formed by the laser beam L and the normal line NL2 of the substrate 40 in case that the laser beam L is reflected by the substrate 40.

The laser beam L reflected by the substrate 40 may pass through the lens 70 again. The laser beam L passing through the lens 70 may be refracted. The laser beam L passing through the lens 70 may be incident on the telecentric f-theta lens 30 again.

The laser beam L passing through the telecentric f-theta lens 30 may be reflected by the second mirror 80. Thereafter, the laser beam L may be inspected by the monitoring unit 60. In an embodiment, the monitoring unit 60 may include a camera.

In an embodiment, Each of the laser beam generator 10 and the monitoring unit 60 may be spaced apart from the substrate 40 with a telecentric f-theta lens 30 and the lens 70 interposed therebetween. Each of the laser beam generator 10 and the monitoring unit 60 may be located on the opposite side of the substrate 40 based on the telecentric f-theta lens 30 and the lens 70. However, the disclosure is not limited thereto.

Figure 9A:
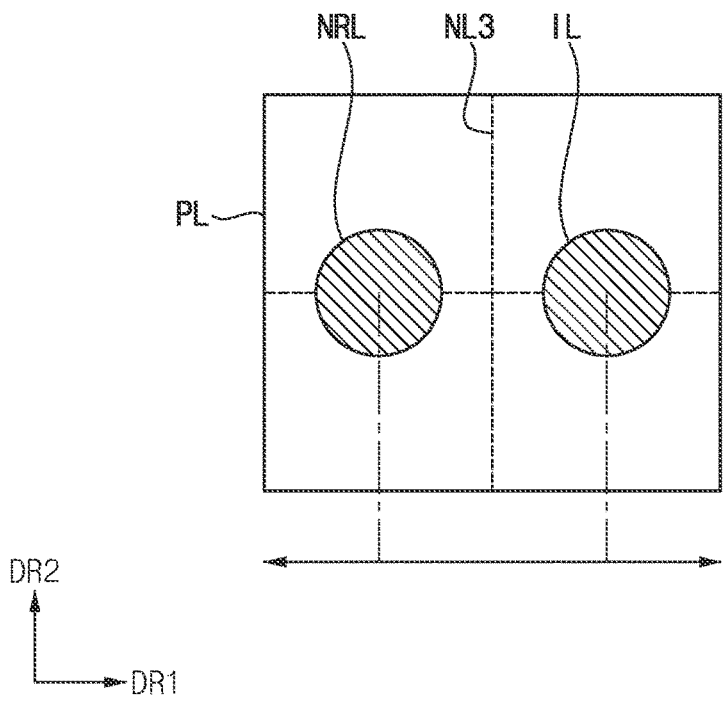
FIGS. 9A and 9B are diagrams schematically illustrating a position distribution of a laser beam measured using the laser crystallization monitoring device of FIG. 7.
Figure 9B:
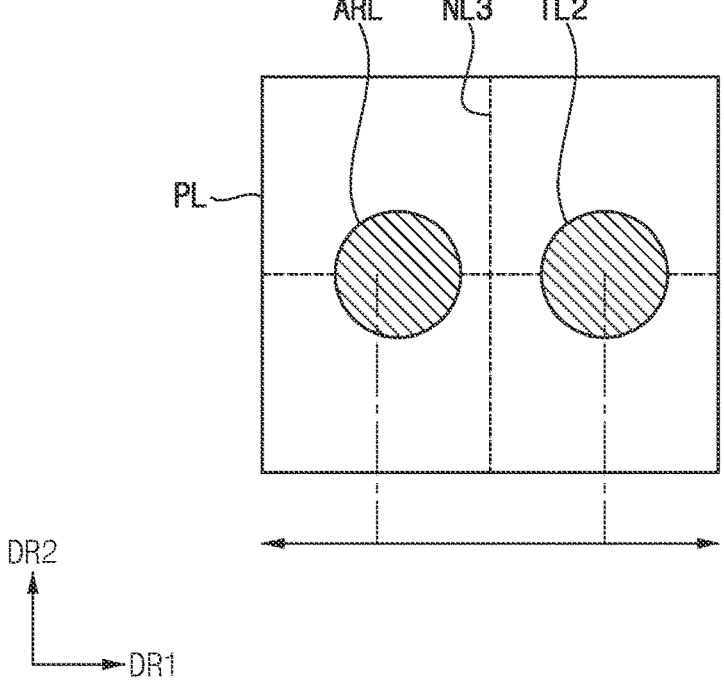

FIGS. 9A and 9B are schematic diagrams illustrating a position distribution of a laser beam measured using the laser crystallization monitoring device of FIG. 7. FIGS. 9A and 9B are enlarged views of a virtual plane PL including the mirror 20 and the monitoring unit 60 of FIG. 8.

Referring to FIG. 7, FIG. 9A and FIG. 9B, FIG. 9A illustrates a laser beam IL incident on the mirror 20 and a laser beam NRL incident on the monitoring unit 60 in a normal state. The normal state may mean a case in which an air trap is not generated in the substrate 40. FIG. 9B illustrates a laser beam IL2 incident on the mirror 20 and a laser beam ARL incident on the monitoring unit 60 in case that an air trap is generated in the substrate 40.

In FIG. 9A, the laser beam IL incident on the mirror 20 and the laser beam NRL incident on the monitoring unit 60 may be symmetrical with respect to an imaginary line NL3 passing through the center of the plane PL. On the other hand, in FIG. 9B, in case that an air trap occurs in the substrate 40, the laser beam IL2 incident on the mirror 20 and the laser beam ARL incident on the monitoring unit 60 may not be symmetrical with respect to the imaginary line NL3 passing through the center of the plane PL.

In an embodiment, the laser crystallization monitoring device may inspect the laser beam L incident on the monitoring unit 60. Accordingly, the laser crystallization monitoring device may monitor the crystallinity of the amorphous silicon layer in real time. Accordingly, since the laser crystallization monitoring device may be appropriately reset, the optimal crystallinity of the amorphous silicon layer may be maintained.

The disclosure can be applied to various laser crystallization monitoring devices. The foregoing is illustrative of embodiments and is not to be construed as limiting thereof. Although a few embodiments have been described, those skilled in the art will readily appreciate that many modifications are possible in the embodiments without materially departing from the novel teachings and advantages of the disclosure. Accordingly, all such modifications are intended to be included within the scope of the disclosure. Therefore, it is to be understood that the foregoing is illustrative of various embodiments and is not to be construed as limited to the specific embodiments disclosed, and that modifications to the disclosed embodiments, as well as other embodiments, are intended to be included within the scope of the disclosure.

What is claimed is:

1. A laser crystallization monitoring device, comprising:
a stage that supports a substrate;
a laser beam generator that emits a laser beam to the substrate;
a mirror that reflects the laser beam emitted from the laser beam generator and that rotates around a rotation axis;
a first telecentric f-theta lens located on the laser beam path between the mirror and the substrate;
a second telecentric f-theta lens through which the laser beam reflected from the substrate passes; and
a monitor that inspects the laser beam passing through the second telecentric f-theta lens,
wherein the second telecentric f-theta lens and the first telecentric f-theta lens are disposed in mirror symmetry with respect to a normal line of the substrate.

2. The laser crystallization monitoring device of claim 1, wherein the mirror is a polygon mirror.

3. The laser crystallization monitoring device of claim 1, wherein the monitor includes a camera.

4. The laser crystallization monitoring device of claim 1, wherein the laser beam forms a polysilicon thin film by crystallizing an amorphous silicon thin film formed on the substrate.

5. The laser crystallization monitoring device of claim 1, wherein
the substrate is disposed on a plane formed by a first direction and a second direction perpendicular to the first direction, and
the stage moves the substrate in the first direction.

6. The laser crystallization monitoring device of claim 5, wherein the mirror continuously changes an irradiation angle of the laser beam.

7. The laser crystallization monitoring device of claim 1, wherein the monitor and the mirror are disposed in mirror symmetry with respect to a normal line of the substrate.

8. The laser crystallization monitoring device of claim 1, wherein the laser beam is a linearly polarized laser beam.

* * * * *